(12) United States Patent
Sandhu

(10) Patent No.: US 6,232,580 B1
(45) Date of Patent: May 15, 2001

(54) APPARATUS FOR UNIFORM GAS AND RADIANT HEAT DISPERSION FOR SOLID STATE FABRICATION PROCESSES

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/549,456

(22) Filed: Apr. 14, 2000

Related U.S. Application Data

(63) Continuation of application No. 09/250,950, filed on Feb. 16, 1999, now Pat. No. 6,064,800, which is a continuation of application No. 08/597,507, filed on Feb. 2, 1996, now Pat. No. 5,892,886.

(51) Int. Cl.[7] ................................................. F27B 11/00
(52) U.S. Cl. ...................... 219/390; 392/416; 118/724; 34/266
(58) Field of Search ................................... 219/390, 405, 219/411; 392/416, 418; 118/724, 725; 34/266, 267, 273, 274

(56) References Cited

U.S. PATENT DOCUMENTS

| | | |
|---|---|---|
| 4,842,686 | 6/1989 | Davis et al. . |
| 4,987,856 | 1/1991 | Hey et al. . |
| 5,108,792 | 4/1992 | Anderson et al. . |
| 5,138,973 | 8/1992 | Davis et al. . |
| 5,336,641 | 8/1994 | Fair et al. . |
| 5,393,564 | 2/1995 | Westmoreland et al. . |
| 5,399,379 | 3/1995 | Sandhu . |
| 5,444,217 | 8/1995 | Moore et al. . |
| 5,446,825 | 8/1995 | Moslehi et al. . |
| 5,577,157 | 11/1996 | Sopori . |
| 5,683,173 | 11/1997 | Gronet et al. . |
| 5,689,614 | 11/1997 | Gronet et al. . |
| 5,755,886 | 5/1998 | Wang et al. . |
| 5,781,693 | 7/1998 | Ballance et al. . |
| 5,892,886 | * 4/1999 | Sandhu ................................. 392/416 |

FOREIGN PATENT DOCUMENTS 59-194427    11/1984  (JP) .

* cited by examiner

Primary Examiner—Teresa Walberg
Assistant Examiner—Shawntina Fuqua
(74) Attorney, Agent, or Firm—Kirkpatrick & Lockhart LLP

(57) ABSTRACT

A gas distribution showerhead for uniformly distributing gas and undistorted radiant heat in an RTP chamber. A gas passageway exists within the showerhead and is suitable for connection to a source of gas. The gas passageway terminates in a plurality of gas ports on a surface of the showerhead. A plurality of energy passageways exist in the showerhead. The energy passageways are exclusive of both the gas passageway and the gas ports, and terminate on the surface of the showerhead. The energy passageways are preferably openings in the showerhead lined with reflectors, although any material which aids in the transmission of the energy may be used. Preferably a plurality of light sources are provided as the energy sources, and they are positioned to transmit light through the energy passageways and out of the surface of the showerhead.

33 Claims, 4 Drawing Sheets

APPARATUS FOR UNIFORM GAS AND RADIANT HEAT DISPERSION FOR SOLID STATE FABRICATION PROCESSES

CROSS-REFERENCE TO RELATED APPLICATIONS

This is a continuation of U.S. patent application Ser. No. 09/250,950, filed Feb. 16, 1999, now U.S. Pat. No. 6,064,800, which is a continuation of U.S. patent application Ser. No. 08/597,507, filed Feb. 2, 1996, now U.S. Pat. No. 5,892,886.

STATEMENT REGARDING FEDERALLY SPONSORED RESEARCH OR DEVELOPMENT

Not Applicable.

BACKGROUND OF THE INVENTION

1. Field of the Invention

The present invention is directed generally to rapid thermal processing devices and, more particularly, to an apparatus used in the fabrication of solid state devices to uniformly disburse gases and distortion-free radiant energy.

2. Description of the Background

In the fabrication of semi-conductor wafers, the deposition of a film on a surface of the wafer is a common and necessary step. The film is typically a semi-conductor, a conductor, or a dielectric. It is well known in the prior art that film deposition occurs more readily on a hot surface than on a cold surface. As a result, it is necessary to heat the surface of the wafer to induce film deposition. Wafers are typically heated and processed either by conventional batch furnace processing or by rapid thermal processing ("RTP").

RTP is an alternative to conventional batch furnace processing and is characterized by short processing times and rapid thermal rise and fall rates. An RTP process step typically lasts between several seconds and 15 minutes, with thermal rise rates typically between 100 and 500° C. per second, and reaching temperatures of 1200° C.

RTP has applications in the fabrication of very large scale integrated ("VLSI") circuits and ultra large scale integrated ("ULSI") circuits. In particular, RTP is used in the fabrication steps of thermal oxidation, thermal nitridation, dopant diffusion, thermal annealing, refractory metal silicide formation, and chemical vapor deposition ("CVD"). CVD may be used to form semi-conductive, conductive, and dielectric films. The design of RTP reactors is well known in the prior art, as disclosed, for example, in U.S. Pat. No. 5,446,825, issued to Moslehi et al., and U.S. Pat. No. 5,444,217, issued to Moore et al. An RTP reactor typically comprises a reaction chamber, a wafer handling system, a gas dispersion apparatus, a heat source, a temperature control system, and a gas control system.

The heat source is often high power lamps which drive chemical reactions in the reaction chamber and heat the wafer, thereby inducing film deposition on the surface of the wafer. The gas dispersion apparatus introduces gases into the reaction chamber so that chemical reactions can take place and films can be deposited on the surface of the wafer. Many types of gas dispersion apparatus are known, and one or more may be located below the wafer, to the side of the wafer, or above the wafer.

CVD process steps require both uniform gas distribution and uniform wafer temperature. If the gases are not distributed evenly over the surface of the wafer, the film will not be deposited evenly. That is in contrast to reactive processes, such as oxidation, which are not as sensitive to the distribution of the gases. That is because the gases in a reactive process are not deposited on the surface of a wafer, but rather react with the surface of the wafer, and therefore the process is self-limiting.

CVD process steps are also dependent on temperature, and if the surface of the wafer is not a uniform temperature, the film will not be deposited in a uniform manner. Furthermore, uneven heating of the wafer can cause slip dislocations, which are fractures in the crystal lattice, that may lead to a device failure.

One type of gas dispersion apparatus used for CVD process steps is known as a "showerhead." Showerheads are located above the wafer, have a generally flat bottom surface with a plurality of gas ports therein, and provide for a generally uniform distribution of gas over the surface of the wafer. Showerheads are made from transparent materials which do not absorb light, such as quartz.

To provide uniform heat to the surface of the wafer, heating lamps are located above the showerhead and separated from the reaction chamber by a transparent window. The use of both single and multiple lamps is known, as disclosed in U.S. Pat. No. 5,444,217, issued to Moore et al. The energy generated by the lamps is intended to travel through both the transparent window and the transparent showerhead, and be absorbed by the surface of the wafer.

It is well know in the prior art, however, that the temperature across a wafer is usually not uniform. One cause of nonuniform heating of a wafer is light distortion caused when light passes through the showerhead. As is well know in the prior art that film deposition occurs more readily on a hot surface than on a cold surface, and although quartz showerheads are very transparent, they still absorb some light and become hot. As a result, film depositions occur on showerheads, and these depositions absorb light, becoming hotter and inducing more film deposition. The result is a build up of film on the showerhead, which in turn blocks and distorts the light passing through the showerhead. This distortion causes uneven heating of the surface of the wafer and results in uneven film deposition, uneven film thickness, and can lead to defects in the wafer. In addition, film deposition on the showerhead may begin to flake, sending particulate matter into the reaction chamber and contaminating the wafer. To minimize those effects, the showerhead must be cleaned or replaced regularly.

Moving the showerhead away from the lamps, such as to the side of the reaction chamber, reduces the temperature of the showerhead but results in a less uniform distribution of gases, which is unacceptable in many applications. Although some other solutions of the light distortion problem have been proposed, such as the use of complex optics or special quartz showerheads, none of the solutions satisfactorily address the problem. Thus, a need exists for a device which both uniformly disperses gas and does not distort the light that is used for heating the surface of the wafer.

SUMMARY OF THE INVENTION

The present invention is directed to an apparatus for uniformly distributing gas via a gas showerhead. A gas passageway is located within the showerhead, and it receives a source of gas and terminates in a plurality of gas ports on a surface of the showerhead. A plurality of energy passageways exist within the showerhead. The energy passageways are exclusive of both the gas passageway and the gas ports. The energy passageways terminate on the surface of the showerhead. The energy passageways are preferably openings in the showerhead lined with reflectors, although any material which aids in the transmission of the energy may be used. Preferably a plurality of light sources are provided as the energy sources, and they are positioned to transmit light through the energy passageways, preferably openings in the showerhead, and out of the surface of the showerhead.

The device of the present invention is preferably embodied in a semi-conductor processing apparatus, such as an RTP system. The apparatus comprises a reaction chamber and a wafer support platform located within the chamber and capable of supporting the wafer. A showerhead is located within the chamber and above the wafer support platform. The showerhead has a surface and a gas passageway for receiving a source of gas via an input connection port. The gas passageway terminates in a plurality of gas ports on the lower surface of the gas dispersion device. A plurality of energy passageways exist in the showerhead. The energy passageways are exclusive of both the gas passageways and gas ports, and they terminate on the surface of the showerhead. Preferably, a plurality of energy sources is positioned to direct energy through the energy passageways and towards the wafer support platform. A window is located between the light sources and the wafer support platform, and a vacuum pump for removing gases is connected to the chamber.

The present invention solves the problem of light distortion by providing a path for the light through the showerhead, separate from the path of the gases through the showerhead and without direct heating of the gas ports. By providing openings in the showerhead corresponding to the light sources, and by focusing the light generated by the light sources through the openings, the heating of the showerhead is significantly reduced. As a result of the reduced heating of the showerhead, as well as no direct heating of the gas ports, film growth on the showerhead is significantly reduced, thereby providing uniform heating and reduced contaminants in the chamber. Those and other advantages and benefits of the present invention will become apparent from the description of the preferred embodiments hereinbelow.

BRIEF DESCRIPTION OF THE DRAWINGS

For the present invention to be clearly understood and readily practiced, the present invention will be described in conjunction with the following figures, wherein.

DESCRIPTION OF THE PREFERRED EMBODIMENTS

Figure 1:
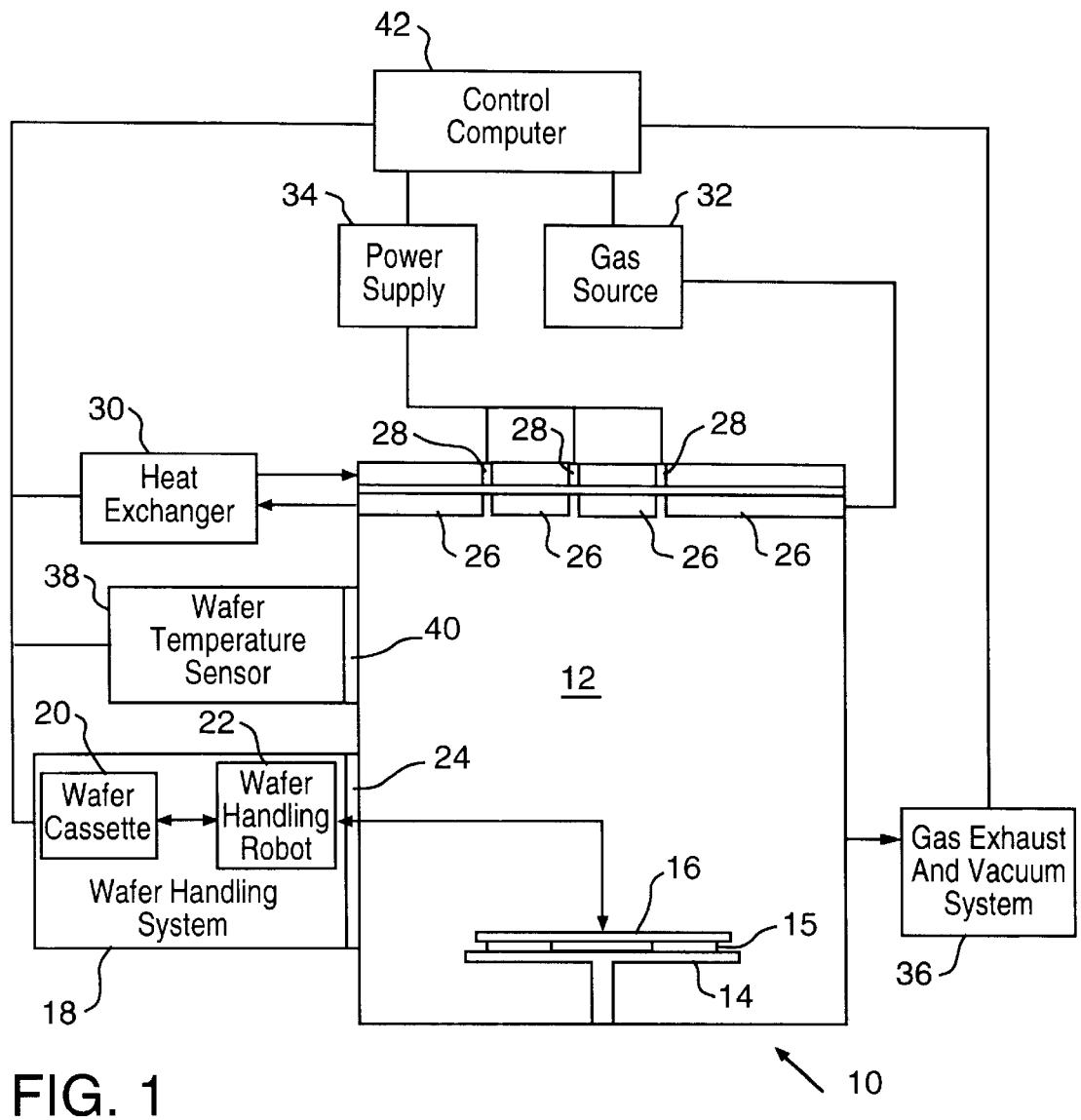
FIG. 1 is a simplified schematic block diagram of an RTP reactor constructed according to the present invention.

FIG. 1 shows a simplified schematic block diagram illustrating a preferred embodiment of the present invention in the context of an RTP reactor 10. It is to be understood that the reactor 10 has been simplified to illustrate only those aspects of the reactor 10 relevant for a clear understanding of the present invention, while eliminating, for the purposes of clarity, many of the elements found in a typical reactor 10. Those of ordinary skill in the art will recognize that other elements are required, or at least desirable, to produce an operational reactor 10. However, because such elements are well-known in the art, and because they do not relate to the design which is the subject of the present invention, a discussion of such elements is not provided herein.

The design and construction of RTP reactors is well known, and the present invention is applicable to any RTP reactor. The RTP reactor 10 of the present invention preferably comprises a cold wall reaction chamber 12 constructed of stainless steel. The bottom and sides of the reaction chamber 12 may be lined with quartz to protect the walls from film deposition during the processing steps. The walls of the reaction chamber 12 may be cooled by a circulating water jacket (not shown) in conjunction with a heat exchanger (not shown). The walls are maintained at or below 100° C., because higher temperatures may induce the deposition of films on the walls of the reaction chamber 12. Such depositions are undesirable because they absorb energy and effect heat distribution within the reaction chamber 12, causing temperature gradients which adversely affect the processing steps. Furthermore, depositions on walls may flake and produce particulates that can contaminate a wafer in the reaction chamber 12.

A wafer support table 14 or the like is located near the bottom of the reaction chamber 12, and is used for supporting a wafer 16. The support table 14 is a flat surface, typically having three or more vertical support pins 15 with low thermal mass.

A wafer handling system 18 is adjacent to the reaction chamber 12, and includes a wafer cassette 20 and a wafer handling robot 22. The wafer cassette 20 holds a plurality of wafers, and the wafer handling robot 22 transports one wafer at a time from the wafer cassette 20 to the wafer support table 14, and back again. A door 24 isolates the wafer handling system 18 from the reaction chamber 12 when the wafers are not being transported to and from the wafer support table 14.

A showerhead 26 introduces gases into the reaction chamber 12, and a plurality of light sources 28 heat the wafer 16. The showerhead 26 and light sources 28 are disclosed in more detail below with respect to FIGS. 2, 3, and 4. For the purposes of this description, the invention will be described in terms of light sources 28, although other sources of heating a wafer 16, such as RF and microwave energy, are known and applicable to the present invention.

The showerhead 26 and light sources 28 are preferably integrated into the roof of the reaction chamber 12. Although the showerhead 26 and light sources 28 may be suspended from the roof, as was done with showerheads in the prior art, integrating the showerhead 26 and the light sources 28 into the roof simplifies the cooling system which cools the light sources 28 and eliminates the need to cool or heavily insulate wires supplying electricity to the light sources 28. The light sources 28 are cooled by one or more known cooling methods, such as liquid or gaseous cooling systems, with heat being dissipated through a heat exchanger 30.

A source of gas 32 is connected to the showerhead 26 to provide the gases disbursed by the showerhead 26 within the reaction chamber 12. More than one type of gas may be available from the source of gas 32, and gases may be provided to the showerhead 26 individually or in combination. The gases may, for example, be used to deposit films on the wafer 16, flush gases from the reaction chamber 12, or cool the reaction chamber 12 and the wafer 16. A power supply 34 is connected to the light sources 28 to provide electricity to power the light sources 28.

Gases are removed from the reaction chamber 12, and a vacuum may be created within the reaction chamber 12, by a gas exhaust and vacuum system 36, as is well known in the prior art. Also present is a wafer temperature sensor 38, such as a pyrometer, which is used to measure the temperature of the wafer 16 through a window 40.

A control computer 42 monitors and controls the various systems which make up the reactor 10, such as the wafer handling robot 22, the heat exchanger 30, and the wafer temperature sensor 38. Data indicating the temperature of the wafer 16 is generated by the wafer temperature sensor 38, and is used by the control computer 42 to adjust the intensity of the light sources 28 so as to produce the desired wafer temperature. In addition, multiple wafer temperature sensors 38 may be used to sense the temperature of different regions of the wafer 16. That data may be used by the control computer 42 to selectively adjust the intensity of some of the light sources 28 so as to compensate for uneven heating of the wafer 16. The control computer 42 also controls when and what gases are provided to the showerhead 26, as well as when gases are removed from the reaction chamber 12, in a known manner.

Figure 2:
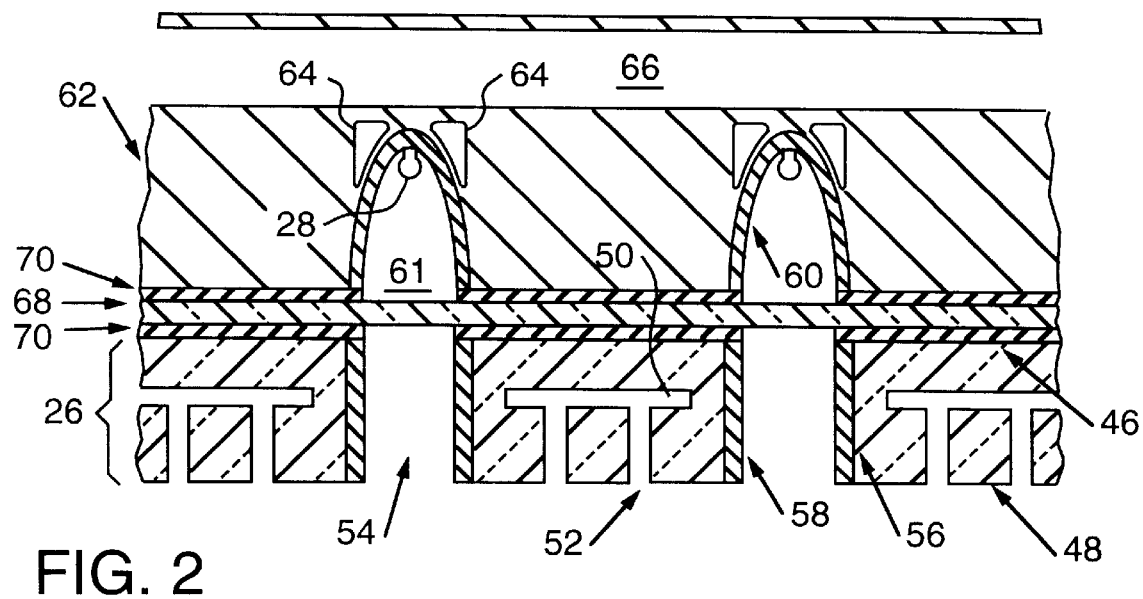
FIG. 2 is a cross-sectional view of a preferred embodiment of a showerhead and lamp housing constructed according to the present invention.

FIG. 2 shows a cross-sectional view of a preferred embodiment of the showerhead 26 and light sources 28. The showerhead 26 may be constructed from a transparent material, such as quartz, sapphire, calcium fluoride, magnesium fluoride or aluminum fluoride. The showerhead 26, however, may also be constructed from non-transparent materials, such as stainless steel or aluminum, since transparency of the showerhead 26 is not required, as described below. The showerhead 26 has an upper surface 46 and a lower surface 48, and includes a gas passageway 50 which connects the source of gas 32 (shown in FIG. 1) with a plurality of gas output ports 52 on the lower surface 48 of the showerhead 26. The gas ports 52 may be shaped and distributed in any manner which promotes the uniform distribution of gas, such as concentric circles and rectangular patterns. The showerhead 26 will typically contain between 50 and 1,000 gas ports 52, with the size of each port preferably being between 0.5 millimeters and 50 millimeters. The gas flow through the showerhead 26 is typically between 100 and 5,000 standard cubic centimeters per minute ("sccm").

The showerhead 26 also has a plurality of openings 54 therein, extending from the upper surface 46 to the lower surface 48, and being defined by inner surfaces 56 of the showerhead 26. The openings 54 are preferably cylindrical in shape, and include reflectors 58 on the inner surfaces 56. The reflectors 58 may be of any design, such as a two-piece design comprising a heat resistant base, made from aluminum or stainless steel, and a reflective coating, made from gold, chromium, silver, or nickel. The reflectors 58 may also be a polished surface of the showerhead 26, for example, when the showerhead 26 is constructed of a metallic material such as stainless steel or aluminum. The purpose of the reflectors 58 is to direct light through the openings 54, while absorbing as little light as possible.

Also shown in FIG. 2 is a plurality of light sources 28. The light sources 28 are preferably quartz-halogen lamps, each rated between 500 and 2000 Watts. There are preferably between 20 and 500 light sources 28, and around the light sources 28 are parabolic reflectors 60. The reflectors 60 redirect the light from the light sources 28 in a downward direction and through the openings 54 in the showerhead 26. The reflectors 60 may be of any design, such as the two-piece design described above with respect to the reflectors 58 in the openings 54.

A housing 62 is in good thermal contact with the light sources 28 and reflectors 60, and fixes their position within lamp openings 61, which are formed in the housing 62. The housing 62 includes a coolant passageway 64 which is adjacent to the reflectors 60 and the light sources 28. The coolant passageway 64 houses a liquid coolant, such as water, which flows through the housing 62, carrying away heat generated by the light sources 28. Satisfactory results are achieved with flow rates between 1 and 3 gallons of water per minute. The water may be cooled, for example, in a heat exchanger 30 (shown in FIG. 1), or it may be a non-recirculating system, wherein cool water constantly enters the system and hot water is discarded.

Optionally, the housing 62 may include an air passageway 66 for forced air cooling of the housing 62. Air cooling is preferably used to supplement the liquid cooling system because it usually does not provide sufficient cooling when used alone. The forced air may be supplied by a blower or a fan, and it is preferably provided at a flow rate of between 1,000 and 10,000 sccm. The air may be cooled through a heat exchanger 30 or an air conditioner (not shown). Alternatively, like the liquid coolant system, the present invention may utilize a non-recirculating system wherein cool air is taken in and hot air is discarded.

The housing 62 is preferably constructed from heat-resistant material, such as stainless steel or aluminum. The housing 62 and the showerhead 26 are separated from each other by a window 68. The window 68 isolates the light sources 28 from the reaction chamber 12. The window is made from a transparent material, such as quartz, sapphire, calcium fluoride, magnesium fluoride and aluminum fluoride, and is preferably between 1.0 and 50 mm thick.

Seals 70 may be provided between the showerhead 26 and the window 68, and between the housing 62 and the window 68. The seals 70 are used because satisfactory sealing usually cannot be achieved with the materials typically used to form a showerhead 26. The use of such seals in RTP chambers and other applications is well known in the art. The seals 70 provide an air tight fit between the showerhead 26, the window 68, and the housing 62. Due to the combination of high temperatures and corrosive materials often used in RTP chambers, high temperature, corrosive-resistant seals may be used. In the preferred embodiment, however, the chamber 12 is adequately cooled so that lower cost seals, such as those sold under the name "Viton", may be used. Seals may be obtained, for example, from Eriks/West, located at 14600 Interurban Avenue S., Seattle, Wash. 98168-4651.

As can be seen in FIG. 2, the light sources 28 in the housing 62 generate light which is directed by the reflectors 60 through the window 68, and through the openings 54 in the showerhead 26. The reflectors 58 along the inner surfaces 56 of the openings 54 further direct the light downward towards the wafer 16. In that way, little or no light passes through the showerhead 26. As a result, heating of the showerhead 26 is substantially reduced, resulting in substantially less film deposition. Furthermore, even if film deposition occurs on the showerhead 26, the light does not travel through the showerhead 26 and so it will not be distorted by film depositions thereon.

Figure 3:
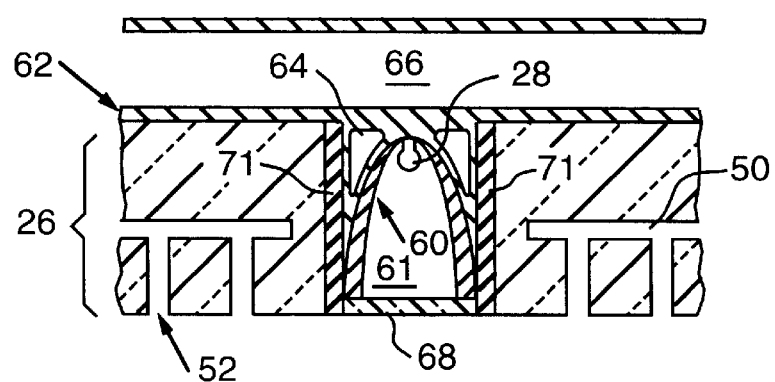
FIG. 3 is a cross-sectional view or an alternative embodiment of a showerhead and lamp housing constructed according to the present invention.

FIG. 3 shows a cross-sectional view of an alternative embodiment of the present invention. As can be seen in FIG. 3, a portion of the housing 62 including the light sources 28 is positioned within the openings 54. This design eliminates the need for the reflectors 58 on the inner surfaces 56 of the showerhead 26. Seals 71 are provided between the windows 68 and the showerhead 26, and between the housing 62 and the showerhead 26.

Figure 4:
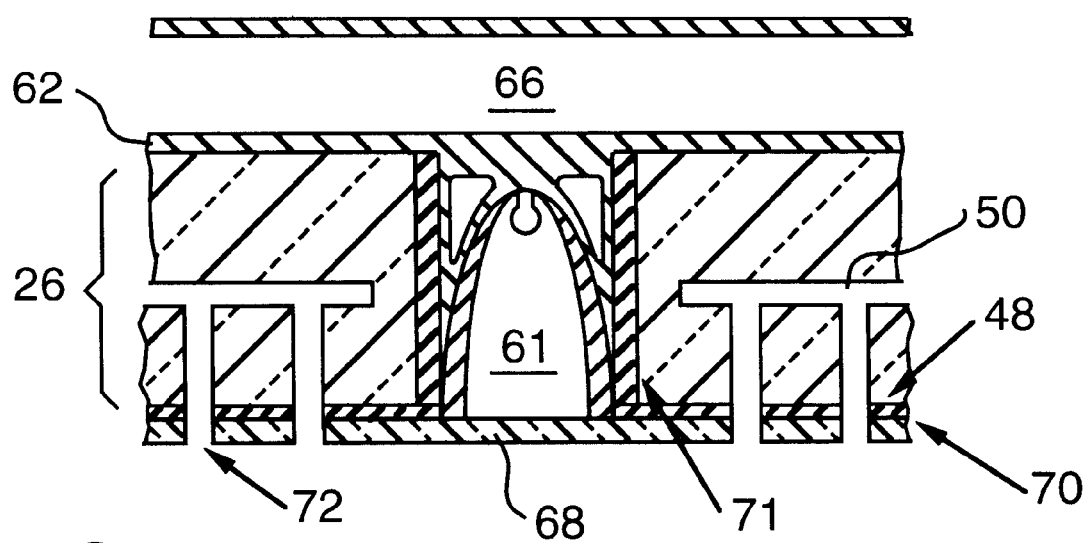
FIG. 4 is a cross-sectional view of an alternative embodiment of a showerhead and lamp housing constructed according to the present invention.

Alternatively, as shown in FIG. 4, the window 68 may be located on the lower surface 48 of the showerhead 26. In that embodiment, holes 72 are provided in the window 68 so that gas may leave the gas ports 52 and enter the reaction chamber 12. Corresponding holes 72 in the seals 70 between the window 68 and the showerhead 26 are also be provided. The seals 71 between the showerhead 26 and the housing 62 are optional, and are usually not needed to obtain a good seal.

Figure 5:
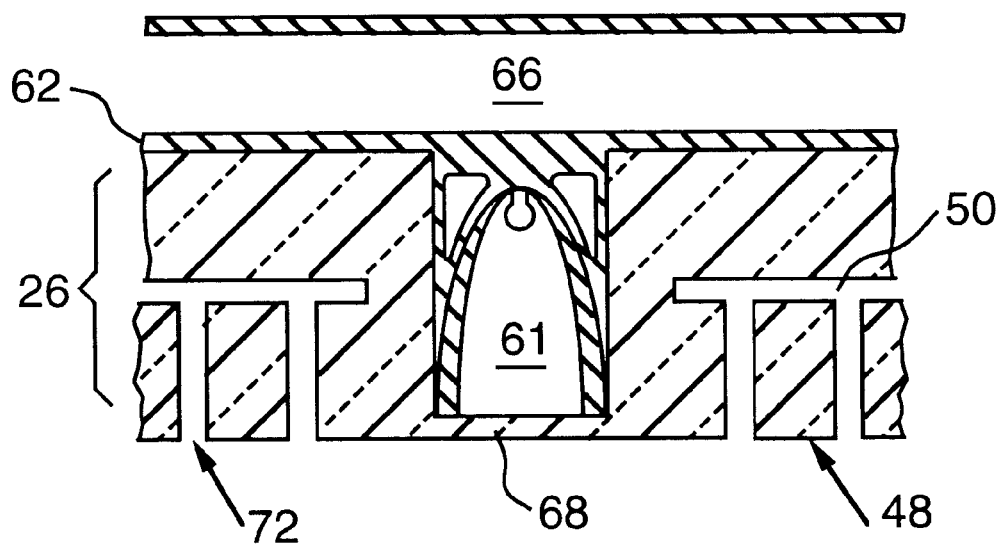
FIG. 5 is a cross-sectional view of an alternative embodiment of a showerhead and lamp housing constructed according to the present invention.

FIG. 5 shows an embodiment wherein the showerhead 26 and windows 68 are a single piece, eliminating the need for seals 70 and 71. In that embodiment the openings 54, which contain a portion of the housing 62, do not extend entirely through the showerhead 26. The window 68, of course, must be transparent to the energy source 28.

Figure 6:
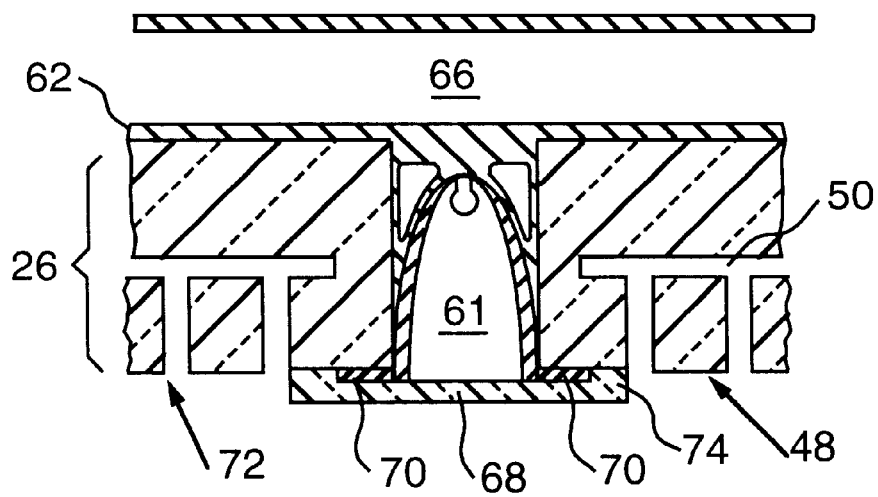
FIG. 6 is a cross-sectional view of an alternative embodiment of a showerhead and lamp housing constructed according to the present invention.

FIG. 6 shows an embodiment wherein the window 68 includes a protective portion 74 which engages the showerhead 26. Although the protective portion 74 usually will not form an airtight seal with the showerhead 26, it protects the seal 70 from a substantial amount of corrosive gases which are often present in an RTP reactor 10, and which can shorten the useful life of the seal 70. In addition, the vertical seals 71 between the showerhead 26 and the housing 62, shown in FIGS. 3 and 4, are preferably not used because the protective portion 74 and the seal 70 together provide sufficient sealing between the window 68 and the showerhead 26.

Figure 7:
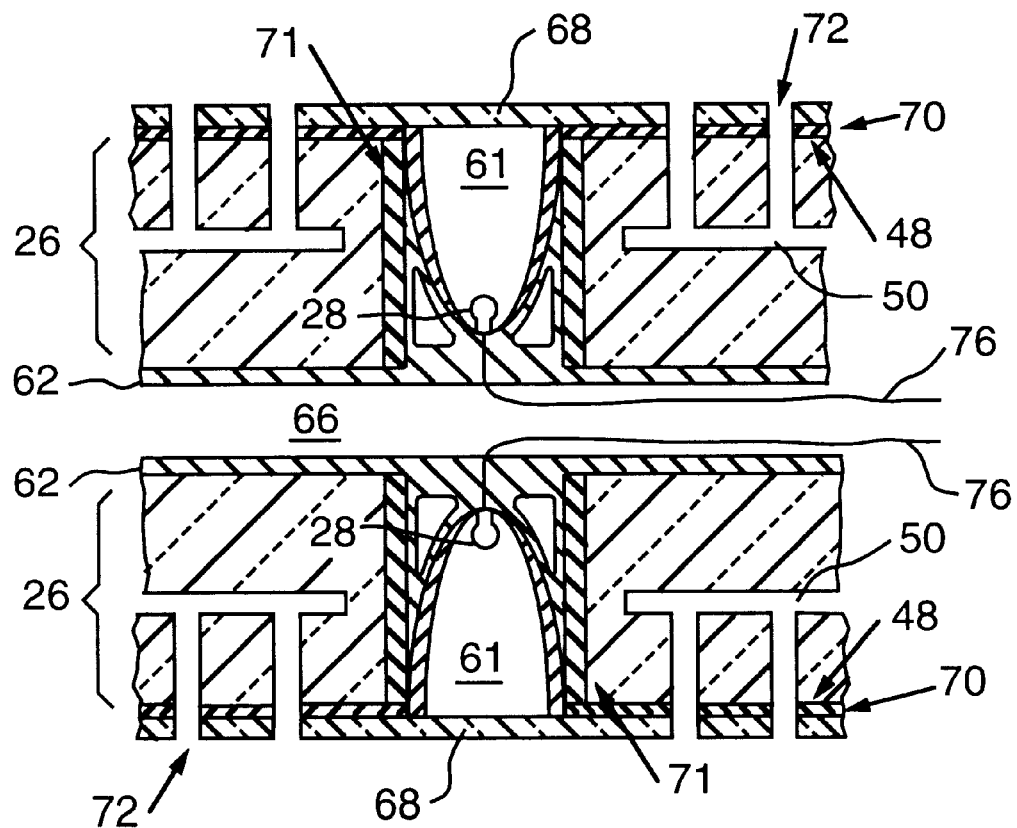
FIG. 7 is a cross-sectional view of an alternative embodiment of a showerhead and lamp housing constructed according to the present invention.

FIG. 7 shows an embodiment wherein two showerheads 26 are integrated around a housing 62. Electrical wires 76 carrying electricity to the light sources 28 are preferably located within the air passageway 66 to keep them cool. That embodiment may be used in a device to process wafers both above and below the showerheads 26 and may share a common gas passageway 50.

Combinations of the disclosed embodiments are possible. For example, the design shown in FIG. 2 will also function with the window 68 located within the openings 54, or on the lower surface 48 of the showerhead 26, as described with respect to FIGS. 3 and 4. The design shown in FIG. 2, however, is preferred because it does not require multiple windows 68, as in the embodiment shown in FIG. 3, and it does not require holes 72 in the window 68 and in the seal 70, as in the embodiment shown in FIG. 4.

It is contemplated that the openings 54 may include materials, or be evacuated, to aid in the efficient transmission of radiant energy. For example, in an embodiment which uses light as the radiant energy, the openings 54 may be sealed and a vacuum created therein, to reduce the scattering of light by the ambient gases, and so that the light is more focused when it exits the showerhead 26. Liquid and solid materials may also be used. Likewise, the lamp opening 61 may also include a material, or be evacuated, to optimize the radiant energy transmission. As a result, the showerhead 26 does not need to contain an opening, but only a passageway for the transmission of radiant energy.

Those of ordinary skill in the art will recognize that many more modifications and variations of the present invention may be implemented. For example, at least some of the benefits of the present invention can be realized by having the showerhead 26 below the wafer 16, or with some light sources 28 providing light through openings 54, while other light sources 28 are providing light in a more conventional manner through the showerhead 26. In addition, other types of energy sources may be used to heat the wafer 16 and the gases in the reaction chamber 12, the locations of the window 68 and the light sources 28 may be modified, the shapes and locations of the coolant, air, and gas passageways 64, 66, and 50 may be modified, and the openings 54 in the showerhead 26 may be modified. Furthermore, the invention may be used in the fabrication of devices other than semiconductor wafers, such as flat panel displays. The foregoing description and the following claims are intended to cover all such modifications and variations.

What is claimed is:

1. An apparatus for processing semiconductor devices, comprising:

a reaction chamber;

a semiconductor device support table located within the chamber;

a gas and radiant energy dispersion apparatus located within the chamber and including:

a surface facing the semiconductor device support table;

a gas passageway having a gas input and having a plurality of gas ports at the surface; and a plurality of energy passageways terminating at the surface and being exclusive of both the gas passageway and the plurality of gas ports; and a plurality of radiant energy sources positioned to direct radiant energy through the plurality of energy passageways and towards the semiconductor device support table.

2. The apparatus of claim 1, wherein the plurality of energy passageways define a plurality of inner surfaces, and further comprising reflectors on the plurality of inner surfaces.

3. The apparatus of claim 1, wherein the plurality of radiant energy sources is selected from the group consisting of a plurality of RF energy sources, a plurality of microwave energy sources, and a plurality of light energy sources.

4. The apparatus of claim 1, wherein the gas and radiant energy apparatus includes a window positioned between the plurality of radiant energy sources and the semiconductor device support table.

5. The apparatus of claim 4, wherein the window comprises a transparent material selected from the group consisting of quartz, sapphire, calcium fluoride, magnesium fluoride, and aluminum fluoride.

6. An apparatus for processing semiconductor devices, comprising:

a reaction chamber;

a semiconductor device support table located within the chamber;

a gas and radiant energy dispersion apparatus located within the chamber having a surface facing the semiconductor device support table, and including a showerhead defining a gas passageway having a gas input and having a plurality of gas ports at the surface, and a housing connected to the showerhead and defining a plurality of energy passageways terminating at the surface and being exclusive of both the gas passageway and the plurality of gas ports; and a plurality of radiant energy sources positioned to direct radiant energy through the plurality of energy passageways and towards the semiconductor device support table.

7. The apparatus of claim 6, wherein the showerhead is constructed from transparent material.

8. The apparatus of claim 7, wherein the transparent material is selected from the group consisting of quartz, sapphire, calcium fluoride, magnesium fluoride, and aluminum fluoride.

9. The apparatus of claim 6, wherein the showerhead is constructed from nontransparent material.

10. The apparatus of claim 9, wherein the non-transparent material is selected from the group consisting of stainless steel and aluminum.

11. The apparatus of claim 6, wherein the housing includes a coolant passageway.

12. The apparatus of claim 6, wherein the housing includes an air passageway.

13. The apparatus of claim 6, wherein the housing is constructed from heat resistant material.

14. The apparatus of claim 13, wherein the heat resistant material is selected from the group consisting of stainless steel and aluminum.

15. The apparatus of claim 6, further comprising a window positioned between the housing and the showerhead.

16. The apparatus of claim 15, wherein a first seal is positioned between the housing and the window, and wherein a second seal is positioned between the window and the showerhead.

17. The apparatus of claim 16, wherein the first and second seals include corrosive-resistant seals.

18. The apparatus of claim 6, further comprising a window positioned between the plurality of radiant energy sources and the semiconductor device support table and proximate the surface.

19. The apparatus of claim 18, wherein a seal is positioned between the showerhead and both the window and a portion of the housing.

20. An apparatus for processing semiconductor devices, comprising:
   a reaction chamber;
   a semiconductor device support table located within the chamber;
   a gas and radiant energy dispersion apparatus located within the chamber having a surface facing the semiconductor device support table, and including a showerhead defining a gas passageway having a gas input and having a plurality of gas ports at the surface, and a housing connected to the showerhead and defining a plurality of energy passageways terminating at the surface and being exclusive of both the gas passageway and the plurality of gas ports;
   a plurality of radiant energy sources positioned to direct radiant energy through the plurality of energy passageways and towards the semiconductor device support table; and
   a window positioned between the surface and the semiconductor device support table.

21. The apparatus of claim 20, wherein the window includes a plurality of openings aligned with the plurality of gas ports.

22. The apparatus of claim 21, wherein a seal is positioned between the surface and the window, wherein the seal includes a plurality of openings aligned with the plurality of gas ports.

23. The apparatus of claim 20, wherein the window is integral with the showerhead.

24. The apparatus of claim 20, wherein the window includes a protective portion which engages the showerhead.

25. The apparatus of claim 24, wherein a seal is positioned between the surface and the window.

26. An apparatus for processing semiconductor devices, comprising:
   a reaction chamber;
   a semiconductor device support table located within the chamber;
   a gas source;
   a gas and radiant energy dispersion apparatus located within the chamber and including:
      a surface facing the semiconductor device support table;
      a gas passageway connected to the gas source and terminating in a plurality of gas ports at the surface; and
      a plurality of energy passageways terminating at the surface and being exclusive of both the gas passageway and the plurality of gas ports;
   a plurality of radiant energy sources positioned to direct radiant energy through the plurality of energy passageways and towards the semiconductor device support table; and
   a control system in communication with the gas source and the plurality of radiant energy sources.

27. The apparatus of claim 26, wherein the control system is in communication with a gas exhaust and vacuum system.

28. The apparatus of claim 26, wherein the control system is in communication with a heat exchanger.

29. The apparatus of claim 26, wherein the control system is in communication with a temperature sensor.

30. The apparatus of claim 26, wherein the control system is in communication with a semiconductor device handling system.

31. An apparatus for processing semiconductor devices, comprising:
   a reaction chamber;
   first and second semiconductor device support tables located within the chamber;
   a gas and radiant energy dispersion apparatus located within the chamber and including:
      a first surface facing the first semiconductor device support table;
      a second surface facing the second semiconductor device support table;
      a first gas passageway having a gas input and terminating in a first plurality of gas ports at the first surface;
      a second gas passageway having a gas input and terminating in a second plurality of gas ports at the second surface;
      a first plurality of energy passageways terminating at the first surface and being exclusive of both the first gas passageway and the first plurality of gas ports; and
      a second plurality of energy passageways terminating at a second surface and being exclusive of both the second gas passageway and the second plurality of gas ports;
   a first plurality of radiant energy sources positioned to direct radiant energy through the first plurality of energy passageways and towards the first semiconductor device support table; and a second plurality of radiant energy sources positioned to direct radiant energy through the second plurality of energy passageways and towards the second semiconductor device support table.

32. An apparatus for processing semiconductor devices, comprising:
 a reaction chamber;
 a semiconductor device support table located within the chamber;
 a gas source;
 a gas and radiant energy dispersion apparatus located within the chamber and including:
  a surface facing the semiconductor device support table;
  a gas passageway having a gas input and terminating in a plurality of gas ports at the surface; and
  a plurality of energy passageways terminating at the surface and being exclusive of both the gas passageway and the plurality of gas ports;
 a plurality of energy sources positioned to direct radiant energy through the plurality of energy passageways and towards the semiconductor device support table;
 a gas exhaust and vacuum system for removing gases from the chamber;
 a heat exchanger for dissipating heat from the plurality of energy sources;
 a temperature sensor for measuring the temperature of a semiconductor device positioned on the semiconductor device support table;
 a semiconductor device handling system in operational engagement with the semiconductor device support table; and
 a control system in communication with the gas source, the plurality of radiant energy sources, the gas exhaust and vacuum system, the heat exchanger, the temperature sensor, and the semiconductor device handling system.

33. An apparatus for processing semiconductor devices, comprising:
 a reaction chamber;
 first and second semiconductor device support tables located within the chamber;
 a gas source;
 a gas and radiant energy dispersion apparatus located within the chamber and including:
  a first surface facing the first semiconductor device support table;
  a second surface facing the second semiconductor device support table;
  a first gas passageway having a gas input and terminating in a first plurality of gas ports at the first surface;
  a second gas passageway having a gas input and terminating in a second plurality of gas ports at the second surface;
  a first plurality of energy passageways terminating at the first surface and being exclusive of both the first gas passageway and the first plurality of gas ports; and
  a second plurality of energy passageways terminating at a second surface and being exclusive of both the second gas passageway and the second plurality of gas ports;
 a first plurality of radiant energy sources positioned to direct radiant energy through the first plurality of energy passageways and towards the first semiconductor device support table; and
 a second plurality of radiant energy sources positioned to direct radiant energy through the second plurality of energy passageways and towards the second semiconductor device support table;
 a gas exhaust and vacuum system connected to the chamber;
 a heat exchanger coupled to the first and second plurality of energy sources;
 a temperature sensor oriented to measure a temperature of a semiconductor device positioned on one of the first and second semiconductor device support tables;
 a semiconductor device handling system in operational engagement with the first and second semiconductor device support tables; and
 a control system in communication with the gas source, the first and second plurality of radiant energy sources, the gas exhaust and vacuum system, the heat exchanger, the temperature sensor, and the semiconductor device handling system.

\* \* \* \* \*